United States Patent
Joo et al.

(10) Patent No.: US 7,371,670 B2
(45) Date of Patent: *May 13, 2008

(54) METHOD FOR FORMING A $(TaO)_{1-x}(TiO)_xN$ DIELECTRIC LAYER IN A SEMICONDUCTOR DEVICE

(75) Inventors: Kwang-Chul Joo, Ichon-shi (KR); Jae-Ok Kim, Ichon-shi (KR)

(73) Assignee: Hynix Semiconductor Inc., Seoul (KR)

( * ) Notice: Subject to any disclaimer, the term of this patent is extended or adjusted under 35 U.S.C. 154(b) by 411 days.

This patent is subject to a terminal disclaimer.

(21) Appl. No.: 11/101,424

(22) Filed: Apr. 8, 2005

(65) Prior Publication Data

US 2005/0202627 A1  Sep. 15, 2005

Related U.S. Application Data

(62) Division of application No. 10/294,575, filed on Nov. 15, 2002, now Pat. No. 6,979,657.

(30) Foreign Application Priority Data

Nov. 27, 2001  (KR) .............................. 2001-74334

(51) Int. Cl.
   *H01L 21/4757*  (2006.01)

(52) U.S. Cl. ................ 438/591; 438/785; 257/E21.625

(58) Field of Classification Search ................. 438/591
   See application file for complete search history.

(56) References Cited

U.S. PATENT DOCUMENTS

| 6,015,739 A | 1/2000 | Gardner et al. |
| 6,069,036 A | 5/2000 | Kim |
| 6,171,900 B1 | 1/2001 | Sun |
| 6,221,712 B1 | 4/2001 | Huang et al. |
| 6,448,128 B1 | 9/2002 | Lee et al. |
| 6,979,657 B2 * | 12/2005 | Joo et al. ............. 438/785 |
| 2004/0087091 A1 * | 5/2004 | Setton ................ 438/287 |

FOREIGN PATENT DOCUMENTS

| GB | 2358283 A * | 7/2001 |
| JP | 11-163322 | 6/1999 |
| JP | 2000-200842 | 7/2000 |

* cited by examiner

*Primary Examiner*—Stephen W. Smoot
(74) *Attorney, Agent, or Firm*—Finnegan, Henderson, Farabow, Garrett & Dunner, L.L.P.

(57) ABSTRACT

The present invention provides a method for forming an improved dielectric layer for semiconductor devices such as gate structures and capacitors. The method utilizes a layer of $(TaO)_{1-x}(TiO)_xN$ (x defined herein) as a substitute for $SiO_2$, together with one or more additional procedures to minimize or prevent channel leakage and other problems that can minimize the performance of the structure.

15 Claims, 3 Drawing Sheets

METHOD FOR FORMING A $(TaO)_{1-x}(TiO)_xN$ DIELECTRIC LAYER IN A SEMICONDUCTOR DEVICE

CROSS REFERENCE TO RELATED APPLICATIONS

This application is a division of application Ser. No. 10/294,575, filed on Nov. 15, 2002, which issued as U.S. Pat. No. 6,979,657 on Dec. 27, 2005 and is related to, and claims the benefit of priority from, application Ser. No.: 2001-74334, filed on Nov. 27, 2001, in the Republic of Korea. The contents of these applications are hereby incorporated herein by reference in their entirety.

FIELD OF THE INVENTION

The present invention relates to a method for fabricating a highly integrated semiconductor device; and, more particularly, to a method for forming a dielectric layer with $(TaO)_{1-x}(TiO)_xN$ ($0.01 \leq x \leq 0.09$) having a high dielectric constant.

BACKGROUND OF THE INVENTION

High dielectric materials have many uses in semiconductor devices. Mainly, high dielectric materials are used to form dielectric layers of capacitors and gate insulators of transistors.

Conventionally, layers of $SiO_2$, having a dielectric constant of 3.85, have been used to form gate insulators. Recently, however, much effort has been spent looking for new materials that have better characteristics than $SiO_2$ with which to form gate insulators and the like. As a result of such efforts, for example, $Ta_2O_5$ has been discovered. $Ta_2O_5$ is a metal oxide having a dielectric constant of 25. It is highly rated as a gate insulator and may advantageously substitute for $SiO_2$ because of its improved characteristics.

Unfortunately, however, $Ta_2O_5$ contains impurities as well. $Ta_2O_5$ layers always contain elements that substitute for Ta. Such elements can cause current leakage, and thus impair the dielectric effect. These impurities can enter the dielectric material through oxygen vacancies. Oxygen vacancies occur due to instabilities in the $Ta_2O_5$ layer itself. The amount of the oxygen vacancies depends on the concentration of the respective elements and the coherence between elements. Nevertheless, it is impossible to remove the oxygen vacancies completely. Thus, to prevent current leakage, one must attempt to stabilize the stoichiometry of the $Ta_2O_5$ through oxidation processes. Such processes change the oxidation state of the impurities that would otherwise substitute for Ta elements within the $Ta_2O_5$ layer. Accordingly, $Ta_2O_5$ gate insulator formation processes becomes complicated owing to a low temperature oxidation processes such as plasma annealing and $UV-O_3$ annealing preformed in-situ or ex-situ.

Where tantalum ethylate $(Ta(OC_2H_5)_5)$ is used as a precursor to $Ta_2O_5$, current leakage also occurs via the carbon elements inside of the $Ta_2O_5$ layer. That is, carbon elements, such as unbounded carbon, $CH_4$ and $C_2H_4$ generated during the deposition process of the $Ta_2O_5$ layer and left in the $Ta_2O_5$ layer deteriorate the quality of the $Ta_2O_5$ layer and degrade its dielectric characteristics.

In order to obtain high dielectric $Ta_2O_5$ layer, one should crystallize the amorphous $Ta_2O_5$ layer using a high temperature oxidation process. During this process, however, a $Si-Ta_x-O_x$ compound oxide layer is changed into $SiO_2$ having a low dielectric constant. As a result, the $Ta_2O_5$ layer loses the merit of metal-based oxide layer having a high dielectric constant.

Alternately, a low temperature oxidation process may be introduced to prevent the $Si-Ta_x-O_x$ compound from converting to $SiO_2$. Such processes do not crystallize the amorphous $Ta_2O_5$ layer, however, making it difficult to obtain a metal based $Ta_2O_5$ layer having a high dielectric constant.

SUMMARY OF THE INVENTION

The present invention provides a method for forming high dielectric layer having low current leakage values and a high insulation breakdown voltage.

In one embodiment, the present invention provides a method for forming a dielectric layer comprising: providing a substrate; performing a first annealing in order to prevent the substrate from oxidizing; forming a $(TaO)_{1-x}(TiO)_xN$ layer on said substrate, wherein x is in the range of about 0.01 to about 0.09; and performing a second annealing for crystallizing the $(TaO)_{1-x}(TiO)xN$ layer.

The present invention also provides a method for forming a dielectric layer comprising: providing a substrate; forming a nitride layer for preventing said substrate from being oxidized; forming a $(TaO)_{1-x}(TiO)_xN$ layer on said nitride layer, wherein x is in the range of about 0.01 to about 0.09; and performing an annealing for crystallizing the $(TaO)_{1-x}(TiO)_xN$ layer.

The present invention also provides a method for forming a dielectric layer comprising: providing a substrate; forming a nitride layer for preventing the substrate from being oxidized; forming a $(TaO)_{1-x}(TiO)_xN$ layer on the nitride layer, wherein x is in the range of about 0.01 to about 0.09; and performing an annealing for crystallizing the $(TaO)_{1-x}(TiO)_xN$ layer and for forming a nitride layer or an oxynitride layer on the $(TaO)_{1-x}(TiO)_xN$ layer.

BRIEF DESCRIPTION OF THE DRAWINGS

The above and other embodiments and features of the present invention will become apparent from the following description of the preferred embodiments given in conjunction with the accompanying drawings.

DETAILED DESCRIPTION OF THE INVENTION

Figure 1:
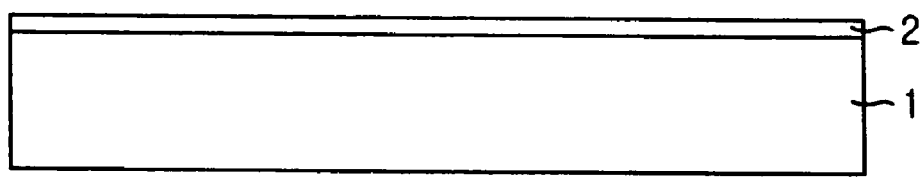
FIGS. 1 to 5 are cross-sectional views illustrating a method for forming a high dielectric layer in accordance with the present invention.

Other embodiments and aspects of the present invention will become apparent from the following description, with reference to the accompanying drawings, which is set forth hereinafter. All units of temperature expressed herein are in degrees centigrade (° C.); all units of thickness are in angstroms (Å), unless otherwise indicated. In the formula, $(TaO)_{1-x}(TiO)_xN$, as used herein, x ranges from about 0.01 to about 0.09.

$(TaO)_{1-x}(TiO)_xN$, wherein x ranges from about 0.01 to about 0.09, may be used to form a gate electrode in accordance with the present invention. $(TaO)_{1-x}(TiO)_xN$, wherein x ranges from about 0.01 to about 0.09, has a dielectric constant of above 40, which has a higher dielectric constant than $SiO_2$. ($SiO_2$ has a dielectric constant of 3.85.) In addition $(TaO)_{1-x}(TiO)_xN$ (x defined above) has a dielectric intensity that is higher than $Ta_2O_5$. This is because $(TaO)_{1-x}(TiO)_xN$ (x defined above) is composed of covalently bonded Ta—O—N compounds and Ti—O—N compounds, which are stable structures due to the covalent bonds. Moreover, $(TaO)_{1-x}(TiO)_xN$ has a insulation breakdown voltage at levels of over 100 MV/cm.

In accordance with the present invention, before forming the $(TaO)_{1-x}(TiO)_xN$ layer, a surface nitridation technology using a plasma treatment or a rapid thermal process may advantageously be carried out to prevent $SiO_2$ layer, having low dielectric constant, from forming at the interface between a substrate and the $(TaO)_{1-x}(TiO)_xN$ layer during the formation of the $(TaO)_{1-x}(TiO)_xN$ layer and a subsequent high temperature annealing process. Accordingly, it is possible to effectively control the oxidation of the interface and to reduce the equivalent oxide thickness of the gate insulator and to prevent the generation of leakage current resulting from a formation of uneven oxide layer.

In addition, in the present invention, after forming a $(TaO)_{1-x}(TiO)_xN$ layer, a high temperature annealing process may advantageously be performed in an atmosphere of $N_2O$ or $O_2$, whereby volatile carbon compounds, such as $CH_4$ and $C_2H_4$, are volatilized, and unbounded carbon is volatilized and oxidized with active oxygen. Accordingly, the generation of the leakage current may be effectively prevented, because the carbon compounds and the unbounded carbon causing the leakage current are removed by the high temperature annealing process. In addition, the structure of the $(TaO)_{1-x}(TiO)_xN$ layer becomes dense and the dielectric constant of the $(TaO)_{1-x}(TiO)_xN$ layer is increased because an amorphous $(TaO)_{1-x}(TiO)_xN$ layer is crystallized by the high temperature annealing process.

Consequently, the nitride process and the high temperature annealing process carried out before and after, respectively, the $(TaO)_{1-x}(TiO)_xN$ layer allows one to obtain a high dielectric $(TaO)_{1-x}(TiO)_xN$ having lower current leakage, sufficient capacitance needed to operate the device, and higher insulation breakdown voltage than $Ta_2O_5$.

FIGS. 1 to 5 are cross-sectional views illustrating a method for forming a gate insulator of a transistor using the $(TaO)_{1-x}(TiO)_xN$ layer in accordance with an embodiment of the present invention.

Referring to FIG. 1, a substrate 1 is provided and a nitridation process is carried out to form a nitride layer 2 on the substrate 1 in order to prevent a low dielectric from forming on the substrate 1 during subsequent procedures in a process for forming a $(TaO)_{1-x}(TiO)_xN$ layer.

The nitridation process may be performed in a low pressure chemical vapor deposition (LPCVD) chamber with plasma at a temperature of 200° C.~600° C. in an atmosphere of $NH_3$, mixed gas of $N_2$ and $H_2$, or $N_2O$ gas for 30 seconds~10 minutes, and thereby the nitride layer 2 is formed to a thickness of from about 5 Å to about 25 Å.

In addition to the above mentioned methods using plasma, methods using a rapid thermal process (RTP) or a furnace annealing process may be performed. When RTP is used, the niridation process may be carried out at a temperature of from about 600° C. to about ~950° C. in an atmosphere of $NH_3$ for from about 1 minute ~30 minutes, and in case of using the furnace, the niridation process may be carried out at a temperature of from 500° C.~1050° C. in an $NH_3$ atmosphere for from about 1 minutes to about ~30 minutes. In addition, where nitrogen or plasma are used, the nitridation process may be performed at a temperature of from about 300 to about ° C.~950° C. in an $NH_3$ atmosphere, or in an atmosphere of a $N_2O$ gas or a gas mixture of $N_2$ and $H_2$.

The nitridation process may be preformed to prevent a low dielectric layer, such as $SiO_2$ layer, from forming between the substrate 1 and the $(TaO)_{1-x}(TiO)_xN$ layer during the process for forming the $(TaO)_{1-x}(TiO)_xN$ layer or during subsequent thermal processes for crystallizing the $(TaO)_{1-x}(TiO)_xN$ layer.

Unwanted low dielectric layers can be prevented more effectively by removing, with HF vapor or solution, an oxide layer on the substrate before the nitridation process. In addition, before or after the process for removing oxide layer, the substrate 1 may be treated with $NH_4OH$ solution or $H_2SO_4$ solution to improve the surface quality of the substrate 1.

Figure 2:
Figure 2:
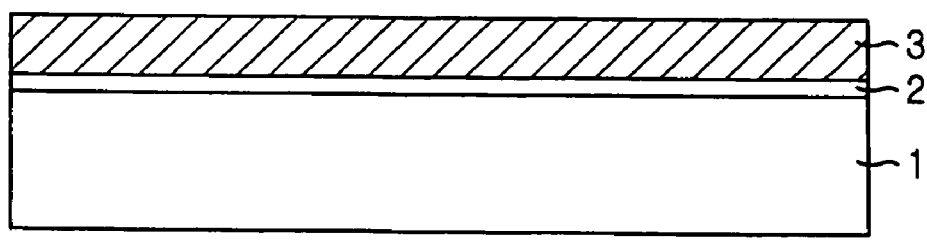

Referring to FIG. 2, an amorphous $(TaO)_{1-x}(TiO)_xN$ ($0.01 \leq x \leq 0.09$) layer 3 is formed on the nitride layer 2 in the LPCVD chamber at a temperature of from about 300° C. to about 600° C. by inducing a surface chemical reaction and by suppressing a gas phase reaction.

The method for forming the amorphous $(TaO)_{1-x}(TiO)_xN$ (x defined as above) layer 3 will be described more in detail.

First, to get a vapor containing Ta element, a predetermined amount of tantalum ethylate $(Ta(C_2H_5O)_5)$ solution is supplied to a vaporizer or a vapor tube through a mass flow controller (MFC), and the $(Ta(C_2H_5O)_5)$ solution is vaporized at a temperature of from about 140° C. to about 200° C.

To get a vapor containing titanium (Ti), a predetermined amount of Ti precursor, such as titanium tetrachloride $(TiCl_4)$, titanium iso-propylate $(Ti[OCH(CH_3)_2])_4)$, tetrakis-dimethylamide-Ti (TDMAT) and tetrakis-diethylamide-Ti (TDEAT), is supplied to a vaporizer or a vapor tube through a mass flow controller (MFC), and the $(Ta(C_2H_5O)_5)$ solution is vaporized at a temperature of from about 200° C. to about 300° C.

The vapors generated by the above procedures react with a reaction gas such as $NH_3$ and $O_2$ at a pressure of 0.1 torr~10 torr, whereby the amorphous $(TaO)_{1-x}(TiO)_xN$ layer 3 is formed. At this time, the reaction gas is flowed at a rate of about 10 sccm to about 1000 sccm and the mole ratio of Ti/Ta is from about 0.01 to about 1.0.

Figure 3:
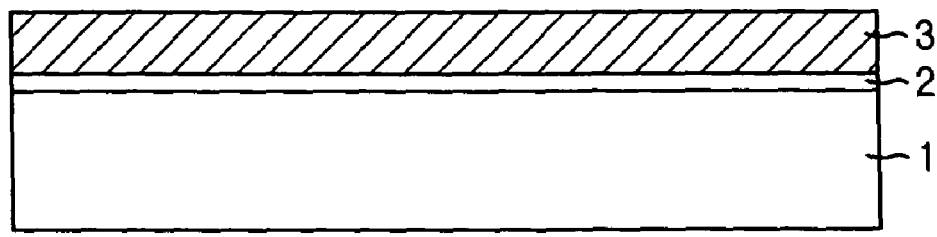

Referring to FIG. 3, a subsequent thermal process may be performed in order to crystallize the amorphous $(TaO)_{1-x}(TiO)_xN$ layer 3. The crystallization of the amorphous $(TaO)_{1-x}(TiO)_xN$ layer 3 may be obtained with various thermal processes. For example, a thermal process may be formed at a temperature of from about 200° C. to about 300° C. in an atmosphere containing oxygen, e.g., $N_2O$ or $O_2$, using plasma, or at a temperature of from about 600° C. to about 950° C. in an atmosphere of $N_2O$ or $O_2$ for from about 30 seconds to about 30 minutes by adopting furnace annealing methods, or at a temperature of from about 600° C. to about 950° C. in an atmosphere of $N_2O$ or $O_2$ for from about 1 minutes to about 120 minutes by adopting RTP.

By the subsequent thermal processes, reaction product impurities, such as carbon compounds, left inside the layer may be removed. The bonding forces are increased by the formation of dense structures. Each of these increases the dielectric constant.

Figure 4:
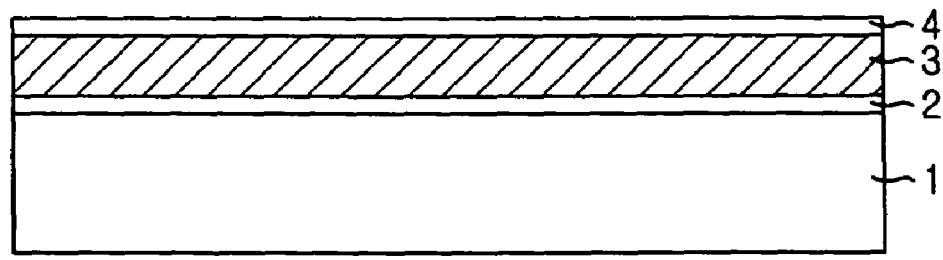

Referring to FIG. 4, a nitride layer or a nitride oxide layer 4 may be formed on the surface of the $(TaO)_{1-x}(TiO)_xN$ layer 3 by crystallizing the $(TaO)_{1-x}(TiO)_xN$ layer 3. That is, the nitride layer or the nitrode oxide layer 4 is formed on the $(TaO)_{1-x}(TiO)_xN$ layer 3 to a thickness of from about 5 Å to about 25 Å, and simultaneously the $(TaO)_{1-x}(TiO)_xN$ layer 3 is crystallized by performing: a dry oxidation or a light oxidation in an atmosphere of $N_2O$ or $O_2$, by performing plasma treatment at a temperature of from about 200° C. to about 600° C. in an atmosphere containing nitrogen, e.g., $NH_3$, mixed gas of $N_2$ and $H_2$, or $N_2O$ gas, or by performing furnace annealing or RTP at a temperature of from about 600° C. to about 950° C. in an atmosphere of $NH_3$, mixed gas of $N_2$ and $H_2$, or $N_2O$ gas for from about 1 minutes to about 30 minutes. With the nitride layer or the nitride oxide layer 4, the defects of structure, such as micro cracks in interfaces and pinholes, are reduced, and it is possible to prevent the low dielectric layer from forming during the foregoing processes.

The $(TaO)_{1-x}(TiO)_xN$ layer 3 formed through the above mentioned processes may be used as a metal-based gate insulator.

Figure 5:
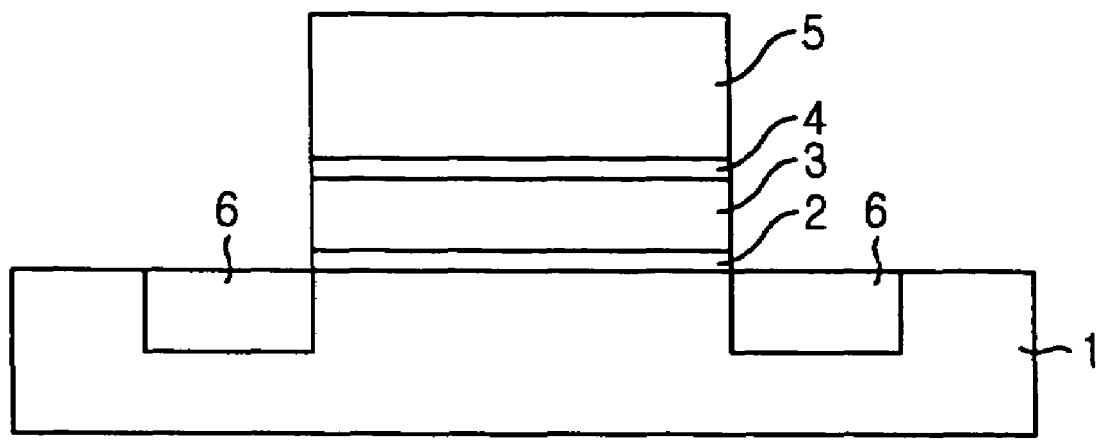

Referring to FIG. 5, a gate electrode 5 is formed of polysilicon on the $(TaO)_{1-x}(TiO)_xN$ layer 3. Suitable substitutes for polysilicon, including TiN, TaN, W, WN, WSi, Ru, $RuO_2$, Ir, $IrO_2$ or Pt, can also be used to form the gate electrode 5. In case of forming the gate electrode 5 with TiN, TaN, WN or WSi, the gate electrode is formed to a thickness of from about 50 Å to about 25 Å, and a doped polysilicon may be deposited as a part of the gate electrode using TiN, TaN, WN or WSi as a conduction barrier.

Thereafter, source/drain regions 6 are formed in the substrate.

The $(TaO)_{1-x}(TiO)_xN$ layer having a high dielectric constant, a low leakage current value and a high insulation breakdown voltage may be used as the gate insulator as mentioned above, and the $(TaO)_{1-x}(TiO)_xN$ layer may be used as a dielectric layer for a capacitor.

Hereinafter, a method for fabricating a capacitor employing a layer of $(TaO)1-x(TiO)xN$ as a dielectric layer will be described in detail.

First, an interlayer insulating layer may be formed on a semiconductor substrate on which a transistor is already formed, and the interlayer insulating layer may be selectively etched to form a contact hole exposing impurity regions, namely source/drain, of the transistor. Thereafter, a poly silicon plug may be formed in the contact hole for electrical connecting the impurity region and a capacitor to be formed.

Next, a layer of titanium is deposited followed by annealing and blanket etching processes, to form a titanium silicide layer. The titanium silicide layerplays the role of a barrier layer on the polysilicon plug. Thereafter, a glue layer for improving adhesion between layers, or a diffusion barrier layer for preventing diffusion of oxygen or hydrogen, may be formed on the titanium silicide layer.

Subsequently, a lower electrode is formed, a $(TaO)_{1-x}(TiO)_xN$ layer is formed on the lower electrode, and an upper electrode is formed on the $(TaO)_{1-x}(TiO)_xN$ layer. The lower and the upper electrodes may each be formed of Pt, Ir, Ru or an alloy thereof.

Accordingly, semiconductor devices employing a $(TaO)_{1-x}(TiO)_xN$ layer as a gate insulator or a dielectric layer of a capacitor can improve semiconductor devices as compared to those employing a $Ta_2O_5$ layer. That is, it is possible to prevent an electrical deterioration, such as a current leakage generated by the unstable stoichiometry of the $Ta_2O_5$, at least in part because the $(TaO)_{1-x}(TiO)_xN$ layer has a high dielectric constant and a stable bonding structure. Moreover, manufacturing costs can be reduced and throughput can be increased, because the annealing process for reducing the leakage current can be omitted in a fabricating procedure of a semiconductor device employing $(TaO)_{1-x}(TiO)_xN$ as compared, e.g., to a semiconductor device adopting $Ta_2O_5$ layer.

While the present invention has been described with respect to certain preferred embodiments, it will be apparent to those skilled in the art that various changes and modifications may be made without departing from the scope of the invention as defined in the following claims.

What is claimed is:

1. A method for forming a dielectric layer, comprising:
   providing a substrate;
   forming a nitride layer for preventing the substrate from being oxidized;
   forming a $(TaO)_{1-x}(TiO)_xN$ layer on the nitride layer, wherein x is in the range from about 0.01 to about 0.09; and
   performing an annealing for crystallizing the $(TaO)_{1-x}(TiO)_xN$ layer and for forming a nitride layer or an oxynitride layer on the $(TaO)_{1-x}(TiO)_xN$ layer.

2. The method of claim 1, wherein said annealing is performed in an atmosphere of $N_2O$ or $O_2$.

3. The method of claim 1, wherein said annealing is performed with plasma at a temperature from about 200° C. to about 600° C. in an atmosphere of a $NH_3$ gas, a $N_2O$ gas or a mixture of $N_2$ and $H_2$ gases.

4. The method of claim 1, wherein said annealing is performed with plasma or a rapid thermal process at a temperature from about 600° C. to about 950° C. in an atmosphere of a $NH_3$ gas, a $N_2O$ gas or a mixture of $N_2$ and $H_2$ gases.

5. A method for forming a gate insulating layer, comprising the steps of:
   providing a semiconductor substrate;
   performing a first annealing in order to prevent the semiconductor substrate from being oxidized;
   forming a $(TaO)_{1-x}(TiO)_xN$ layer on the semiconductor substrate, wherein the x is in the range from about 0.01 to about 0.09; and
   performing a second annealing for crystallizing the $(TaO)_{1-x}(TiO)_xN$ layer, wherein a nitride or an oxynitride layer is formed on the $(TaO)_{1-x}(TiO)_xN$ layer by the second annealing.

6. The method of claim 5, wherein the $(TaO)_{1-x}(TiO)_xN$ layer is formed by a surface chemical reaction between a vapor containing Ti and a vapor containing Ta.

7. The method of claim 6, wherein the mole ratio of Ti/Ta is from about 0.01 to about 1.0.

8. The method of claim 6, wherein the $(TaO)_{1-x}(TiO)_xN$ layer is formed using $NH_3$ gas and $O_2$ gas as reaction gases.

9. The method of claim 6, wherein the vapor containing Ti element is obtained by vaporizing a $Ti[OCH(CH_3)_2]_4$ solution at a temperature from about 200° C. to about 300° C.

10. The method of claim 6, wherein the vapor containing Ti element is obtained from a precursor selected from a group consisting of $TiCl_4$, TDMAT (tetrakis-dimethylamid) and TDEAT (tetrakis-diethylamide-Ti).

11. The method of claim 6, wherein said vapor containing Ta element is obtained by vaporizing a $Ta(C_2H_5O)_5$ solution at a temperature from about 140° C. to about 200° C.

12. The method of claim 5, wherein the first annealing is performed using plasma or rapid thermal process in an atmosphere of oxygen at a temperature from about 600° C. to about 950° C.

13. The method of claim 5, wherein the second annealing is performed using plasma in an atmosphere of nitrogen at a temperature from about 200° C. to about 600° C.

14. The method of claim 5, wherein the second annealing is performed using furnace in an atmosphere of $N_2O$ or $O_2$ at a temperature from about 600° C. to about 950° C.

15. The method of claim 5, wherein the second annealing is performed using a rapid thermal process in an atmosphere of $N_2O$ or $O_2$ at a temperature from about 600° C. to about 950° C.

* * * * *